(12) United States Patent
Koyama et al.

(10) Patent No.: US 7,952,441 B2
(45) Date of Patent: *May 31, 2011

(54) ELECTROMAGNETIC-WAVE OSCILLATOR

(75) Inventors: Yasushi Koyama, Yokahama (JP);
Takeaki Itsuji, Hiratsuka-si (JP);
Toshihiko Ouchi, Sagamihara (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/606,304

(22) Filed: Oct. 27, 2009

(65) Prior Publication Data

US 2010/0045392 A1    Feb. 25, 2010

Related U.S. Application Data

(62) Division of application No. 11/751,517, filed on May 21, 2007, now Pat. No. 7,622,999.

(30) Foreign Application Priority Data

May 31, 2006  (JP) .................................. 2006-150924
Dec. 26, 2006  (JP) .................................. 2006-349233

(51) Int. Cl.
*H03B 7/08* (2006.01)
(52) U.S. Cl. .............. 331/107 T; 331/107 SL; 257/506; 343/700 MS
(58) Field of Classification Search ............... 331/107 T, 331/107 SL, 108 C, 108 D, 185; 257/506; 343/700 MS
See application file for complete search history.

(56) References Cited

U.S. PATENT DOCUMENTS

| | | | |
|---|---|---|---|
| 3,611,146 A | 10/1971 | Cooper et al. ................ 257/664 |
| 3,659,222 A | 4/1972 | Assour et al. .................... 331/99 |
| 4,232,277 A | 11/1980 | Dickens et al. ......... 331/107 DP |
| 5,675,295 A | 10/1997 | Brebels et al. ................ 331/105 |
| 7,248,995 B2 | 7/2007 | Itsuji et al. .................... 702/158 |
| 7,463,104 B2 | 12/2008 | Sekiguchi et al. ....... 331/107 SL |
| 7,531,804 B2 | 5/2009 | Itsuji ........................... 250/341.1 |
| 7,557,588 B2 | 7/2009 | Ouchi et al. .................. 324/637 |
| 2006/0061510 A1 | 3/2006 | Itsuji ............................. 343/700 |
| 2006/0085160 A1 | 4/2006 | Ouchi ........................... 702/150 |
| 2006/0188398 A1 | 8/2006 | Yano et al. ................. 422/82.01 |
| 2006/0197021 A1 | 9/2006 | Ouchi ........................... 250/343 |
| 2006/0214176 A1 | 9/2006 | Ouchi et al. .................... 257/98 |

(Continued)

OTHER PUBLICATIONS

S Suzuki et al., "Proposal of THz Oscillator with Strongly Coupled Array Structure of Resonant Tunneling Diodes", *Preliminary Papers at the 53rd JSAP* (Japan Society of Applied Physics) related lecture, 2006 Spring, No. 3, 23p- M - 2, p. 1171 (English translation submitted).

(Continued)

*Primary Examiner* — Levi Gannon
(74) *Attorney, Agent, or Firm* — Fitzpatrick, Cella, Harper & Scinto

(57) ABSTRACT

An electromagnetic-wave oscillator includes a substrate, an EMW oscillating unit including a gain portion, an EMW resonance portion, an EMW radiating portion, and a ground (GND) portion, and a supplying unit for supplying electric power to the EMW oscillating unit. The ground portion regulates a predetermined reference electric potential for the gain portion, the EMW resonance portion, and the EMW radiating portion. The EMW oscillating unit is disposed on a first surface of the substrate. The supplying unit is disposed on a second surface of the substrate extending on an opposite side to the first surface. The EMW oscillating unit and the supplying unit are electrically connected via a penetrating electrode formed in the substrate.

7 Claims, 7 Drawing Sheets

U.S. PATENT DOCUMENTS

| | | |
|---|---|---|
| 2006/0227340 A1 | 10/2006 | Shioda et al. ............... 356/614 |
| 2006/0244629 A1 | 11/2006 | Miyazaki et al. ........ 340/855.7 |
| 2007/0030115 A1 | 2/2007 | Itsuji et al. ................... 340/5.8 |
| 2007/0195921 A1 | 8/2007 | Ouchi ............................ 378/1 |
| 2007/0215808 A1 | 9/2007 | Sekiguchi et al. ...... 250/339.01 |
| 2007/0215810 A1 | 9/2007 | Kurosaka et al. .......... 250/358.1 |
| 2007/0229094 A1 | 10/2007 | Kasai et al. ................. 324/639 |
| 2007/0235718 A1 | 10/2007 | Kasai et al. ................... 257/21 |
| 2007/0252992 A1 | 11/2007 | Itsuji ........................... 356/369 |
| 2007/0279143 A1 | 12/2007 | Itsuji ...................... 343/700 MS |
| 2008/0048678 A1 | 2/2008 | Kurosaka et al. ............ 324/639 |
| 2008/0048792 A1 | 2/2008 | Ouchi et al. ............... 331/107 T |
| 2008/0314152 A1 | 12/2008 | Ouchi ............................ 73/597 |
| 2009/0009190 A1 | 1/2009 | Itsuji ........................... 324/639 |

OTHER PUBLICATIONS

ER Brown et al. "Oscillations up to 712 Ghz in InAs/AlSb Resonant-Tunneling Diodes", American Institute of Physics, *Appl. Phys. Lett.*, vol. 58, No. 20, pp. 2291-2293 (May 20, 1991).

J Lin et al., Two-Dimensional Quasi-Optical Power-Combining Arrays Using Strongly Coupled Oscillators, *IEEE Transactions on Microwave Theory and Techniques*, vol. 42, No. 4, pp. 734-741 (Apr. 4, 1994).

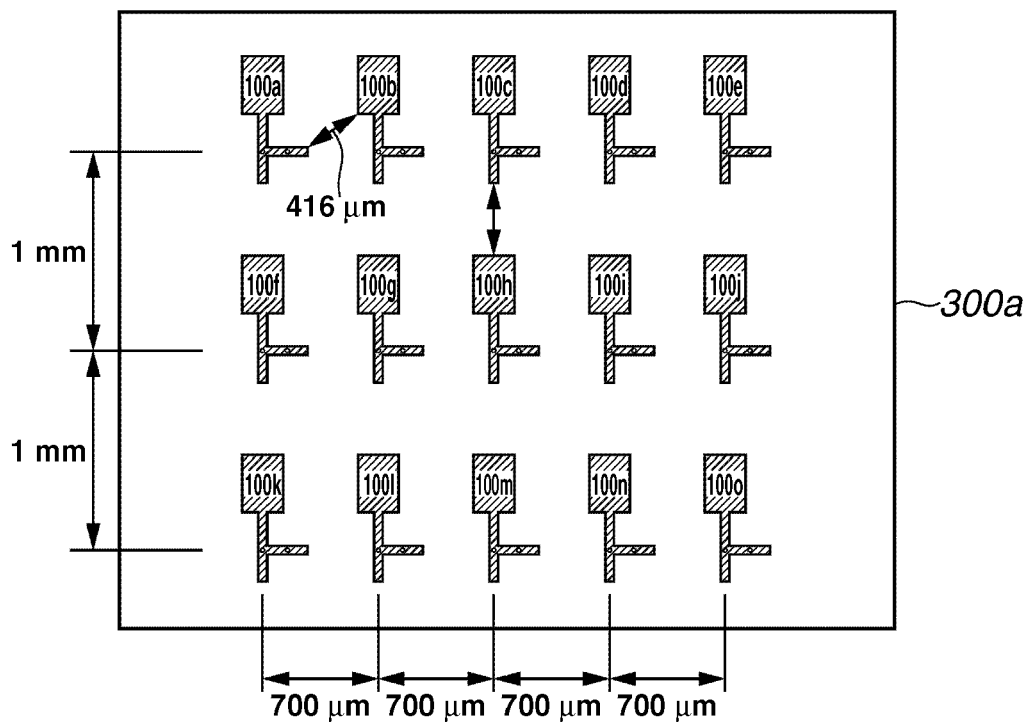
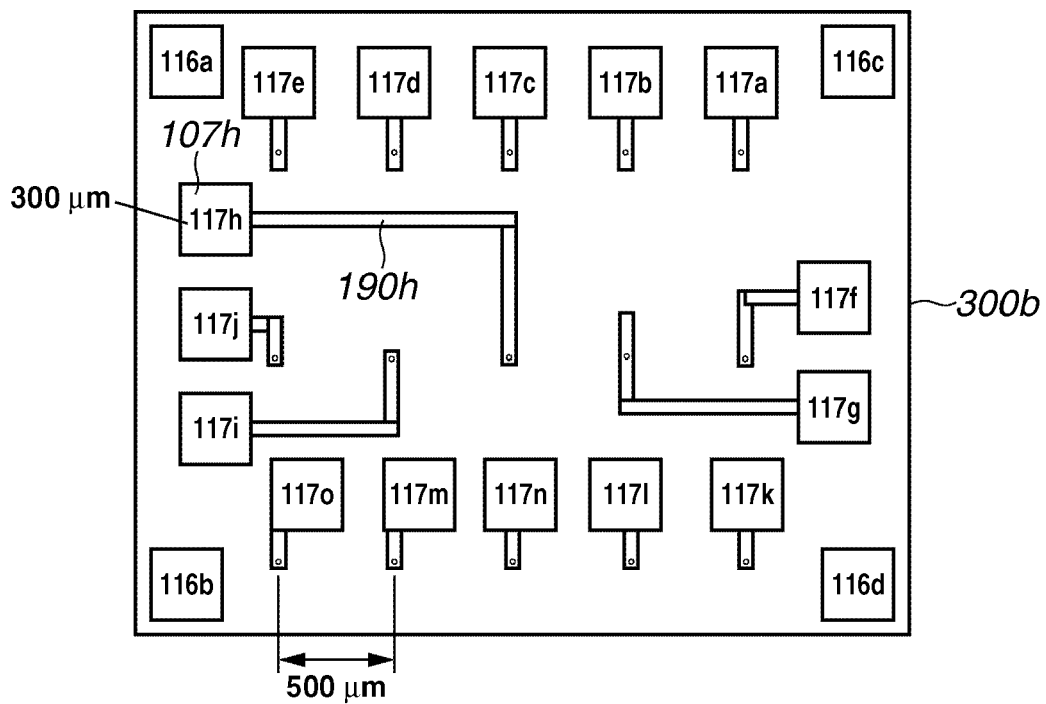

PRIOR ART

ELECTROMAGNETIC-WAVE OSCILLATOR

RELATED APPLICATIONS

This application is a divisional of patent application Ser. No. 11/751,517, filed May 21, 2007, claims benefit of the filing date thereof under 35 U.S.C. §120, and claims priority benefit under 35 U.S.C. §119 of the filing dates of Japanese patent applications nos. 2006-150924 and 2006-349233, filed May 31, 2006, and Dec. 26, 2006, respectively. The entire contents of each of the three mentioned prior applications are incorporated herein by reference.

BACKGROUND OF THE INVENTION

1. Field of the Invention

The present invention relates to an electromagnetic-wave (EMW) oscillator. Particularly, the present invention relates to an EMW oscillator for emitting an electromagnetic wave at a frequency or frequencies including at least a portion of a frequency range from 30 GHz to 30 THz. Electromagnetic waves including at least a component in the above frequency range are called terahertz (THz) waves in this specification.

2. Description of the Related Background Art

In recent years, techniques using a THz wave in communications field, security field, medical field, and so forth have been energetically researched and developed. The THz wave has characteristics of penetrating and straightly propagating through a substance. It is, therefore, possible to obtain inner information of a substance at high resolution by using a THz wave reflected by, or transmitted through, the substance. Accordingly, various non-destructive or non-invasive inspection techniques have been researched and developed.

Some examples of these inspection techniques include a technique for securely performing a seeing-through or perspective imaging of a substance using a THz wave in place of X-rays, a spectroscopic technique for inspecting the bonding condition of a molecule by obtaining the absorption spectrum and the complex dielectric constant of a substance, a technique for estimating the carrier density and the mobility of a superconductive material, a technique for analyzing a biomolecule, such as DNA and proteins, etc.

The development of a THz-wave source is indispensable to put the above techniques into a practical use. To date, there have been developed THz-wave generating techniques using laser apparatuses, such as a photoconductive device capable of being excited by a femtosecond (fsec) laser light, and a THz-wave parametric oscillator using a non-linear optical crystal. Further, there have also been developed THz-wave generating techniques using a small-sized electron vacuum tube, such as a backward-wave oscillator (BWO) and a gyrotron, and a large-sized electron beam accelerator, such as a free electron laser. According to those techniques, the oscillating frequency is changeable, and the output power is large, so that those techniques are highly effective in particular uses, such as the identification of fingerprint spectra of various substances. However, in those techniques, the size of an apparatus increases, and hence its general or industrial use is restricted.

The following oscillators have been developed as a small-sized radiation source. For example, some oscillators are constructed by combining active elements using the negative resistance generated by the movement or transition of electrons in a semiconductor due to injection of a current thereinto, such as a Gunn diode and a resonance tunnel diode (RTD), with a variety of antennas (or resonance structures). In this way, a small-sized oscillator with a single oscillation frequency can be realized, though its output is low (especially low in an oscillator for emitting a THz wave). Therefore, such oscillators are expected to be applied to various uses. Conventional examples of such a small-sized oscillator will be described in the following.

"APL, Vol. 58 (20), p. 2291, 1991" discloses a small-sized oscillator constructed by the combination of an active element of a double barrier RTD with AlSb barrier layers (1.5 nm in thickness) and InAs quantum well layers (6.4 nm in thickness) grown by a molecular beam epitaxy (MBE), and a square (300 microns×150 microns) waveguide serving as a resonance structure. According to this referenced paper, oscillation at a frequency of 712 GHz is achieved by a single device, and its output is 0.3 microwatt.

Further, "IEEE, Transactions on microwave theory and techniques, Vol. 42, No. 4, 1994" discloses a planar integrated Gunn diode array constructed by the combination of an active element of a GaAs Gunn diode, and a microstrip line (MSL) patch antenna serving as a resonance structure.

FIG. 7 illustrates this planar integrated Gunn diode array. According to this referenced paper, it is possible to collectively fabricate the active element (negative resistance element), the resonance structure (antenna), and a DC (direct current) supplying portion (circuit and electrode for performing the DC supply to the active element) on a substrate, using a conventional semiconductor process. Accordingly, decrease in a size of the oscillator, increase in an output by arraying the structures, and improvement in oscillation characteristics are expected. According to this referenced paper, oscillation at 12.423 GHz is achieved in a Gunn diode of a 4×1 linear array type (illustrated in FIG. 7), and oscillation at 12.395 GHz is achieved in a Gunn diode of a 2×2 loop array type.

Furthermore, "Preliminary Papers at the 53rd JSAP (Japan Society of Applied Physics)-related lecture, 2006 spring, No. 3, 23p-M-2" suggests as follows. As a method for overcoming the problem of a low output power in a range of the THz wave, it is expected that the output power of an oscillator in a range of 330 GHz can be increased by mutually synchronizing current injections into densely arrayed oscillating elements.

In conventional THz-wave oscillators of the planar integrated type, it is necessary to arrange a DC supplying portion including elements, such as a circuit, an extraction electrode, and a bonding wire, on a substrate, in addition to an EMW radiating portion including elements, such as a negative resistance element, an antenna, an EMW resonance portion. The size of the DC supplying portion is in the order of approximately 1 mm$^2$. It is therefore likely that the DC supplying portion occupies a considerable space, and the flexibility of design of the EMW radiating portion on the substrate is reduced. Further, the DC supplying portion and the EMW radiating portion are disposed on the same substrate, so a THz wave emitted from the radiating portion is likely to interfere with the DC supplying portion. Also in this respect, the flexibility of design tends to be restricted. As a result, it is not easy to densely array THz-wave oscillators of the planar integrated type.

SUMMARY OF THE INVENTION

The present invention provides an electromagnetic-wave oscillator capable of addressing the above problems.

According to one aspect of the present invention, there is provided an electromagnetic-wave oscillator, which includes a substrate, an EMW oscillating unit including a gain portion, an EMW resonance portion, an EMW radiating portion, and a ground (GND) portion, and a supplying unit for supplying electric power to the EMW oscillating unit. The ground portion regulates a predetermined reference electric potential for the gain portion, the EMW resonance portion, and the EMW radiating portion. The EMW oscillating unit is disposed on a first surface of the substrate. The supplying unit is disposed on a second surface of the substrate extending on an opposite side to the first surface. The EMW oscillating unit and the supplying unit are electrically connected via a penetrating electrode formed in the substrate.

According to another aspect of the present invention, the EMW oscillating unit and the supplying unit are disposed on mutually opposite surfaces of the substrate, respectively, and the penetrating electrode is formed in the substrate to connect the EMW oscillating unit and the supplying unit. Accordingly, the flexibility of design of the EMW oscillating unit on the substrate is increased, and the possibility of interference between an electromagnetic wave radiated from the EMW radiating portion and the supplying unit is reduced.

Further, it becomes easy to dispose a curved lens plate, such as a semi-spherical lens plate, on the surface of the substrate. In this structure, it is possible to couple an electromagnetic wave radiated from the oscillator to the lens plate, and appropriately shape a beam of the electromagnetic wave. Thus, the electromagnetic wave can be efficiently transmitted from the oscillator.

The features of the present invention will be more readily understood in connection with the following detailed description of embodiments and examples of the invention in connection with the drawings.

BRIEF DESCRIPTION OF THE DRAWINGS

FIG. 3A is a plan view illustrating an upper plane of an array of oscillators of the first embodiment.

FIG. 3B is a plan view illustrating a lower plane of the array of oscillators of the first embodiment.

DESCRIPTION OF EMBODIMENTS

Embodiments of an EMW oscillator of the present invention will hereinafter be described with reference to the drawings.

Figure 1:
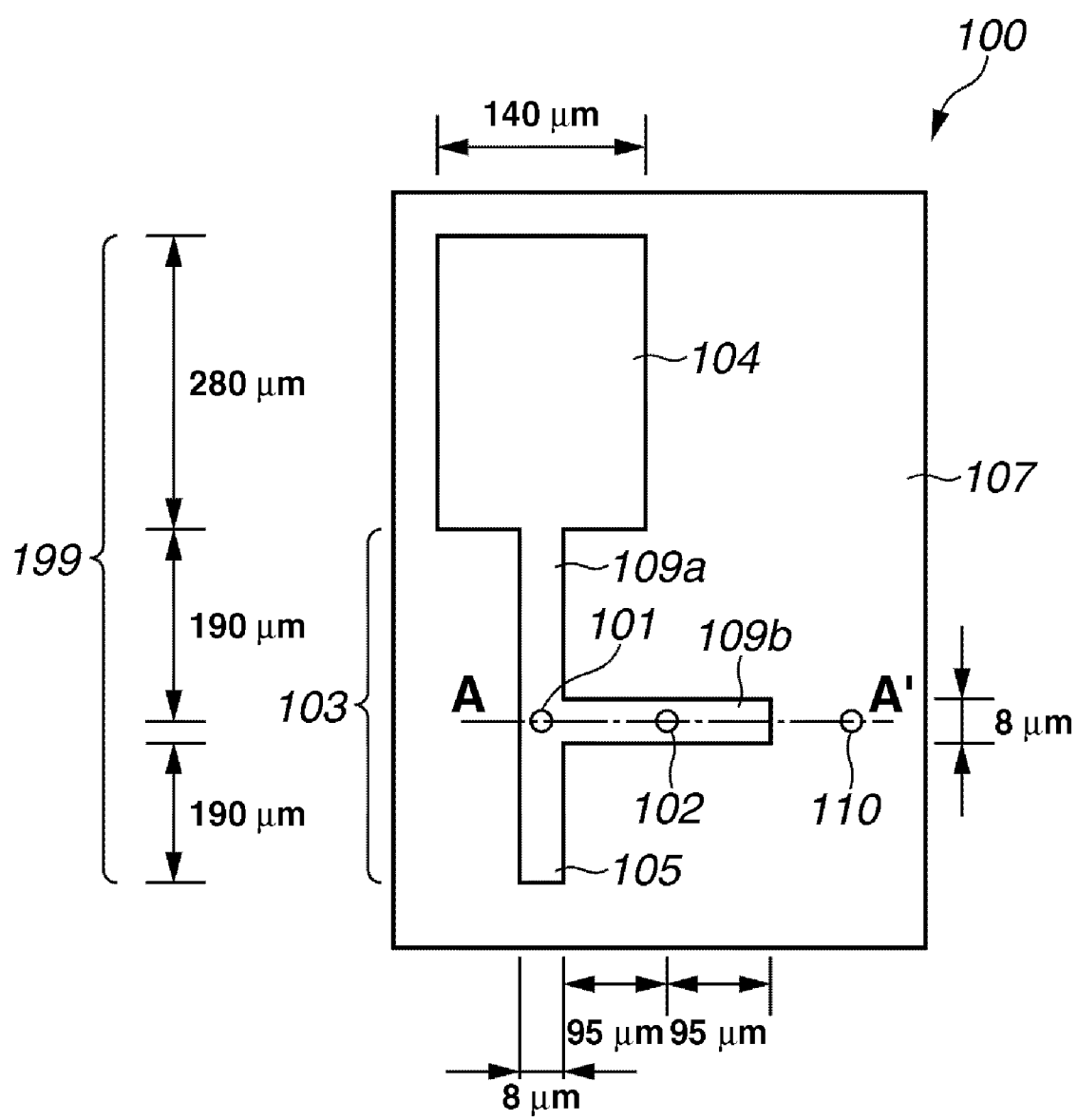
FIG. 1 is a plan view illustrating a first embodiment of an EMW oscillator according to the present invention.
Figure 2:
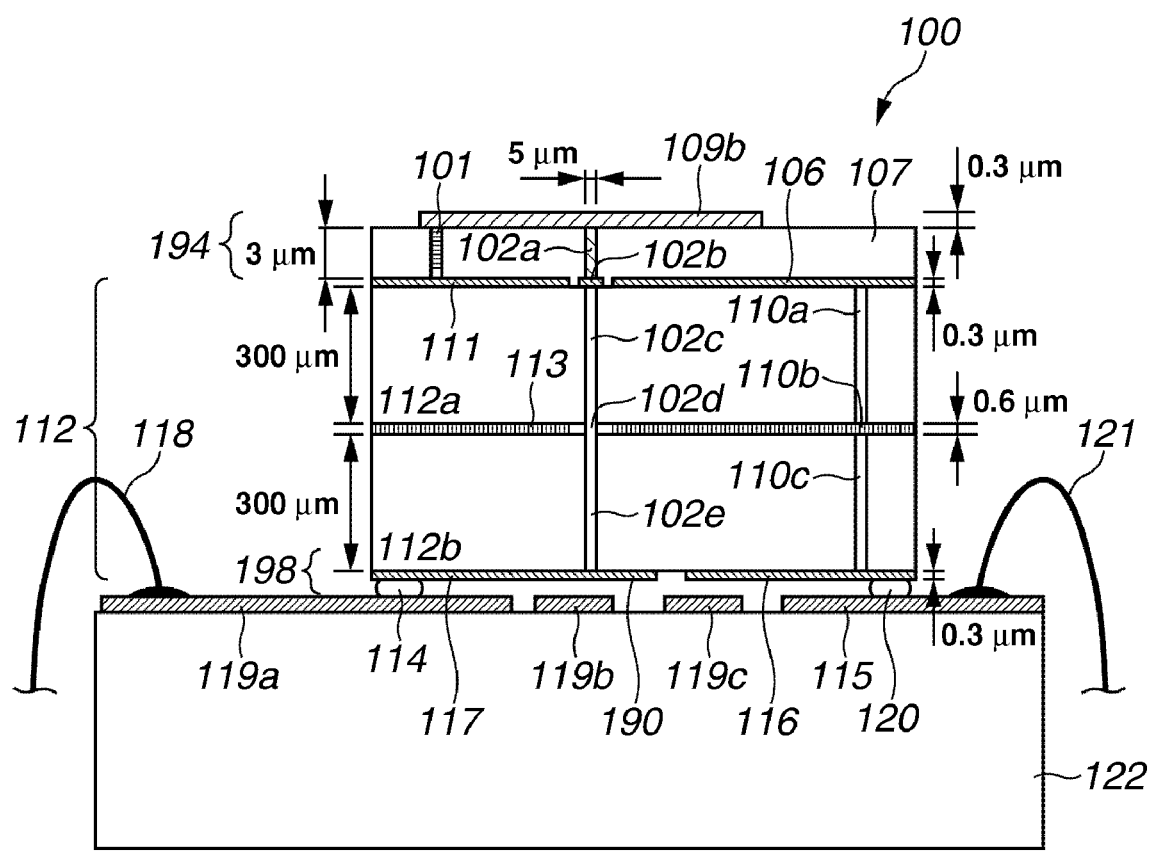
FIG. 2 is a cross-sectional view taken along line A-A' of FIG. 1.

A first embodiment of a THz-wave oscillator of the planar integrated type will be described. FIG. 1 is a plan view of the first embodiment. FIG. 2 is a cross-sectional view taken along line A-A' of FIG. 1. An installation substrate 122 and electric wires 118 and 121, which are depicted in FIG. 2, are omitted in FIG. 1. FIGS. 3A and 3B are upper and lower plan views illustrating an array of oscillators illustrated in FIGS. 1 and 2.

As illustrated in FIGS. 1 and 2, an oscillator 100 of this embodiment includes an EMW oscillating unit 194 disposed on an upper surface of a substrate 112, and a DC supplying unit 198, which is disposed on a lower surface of the substrate 112, for supplying DC electric power to the EMW oscillating unit 194. The EMW oscillating unit 194 and the supplying unit 198 are electrically connected via a penetrating electrode 102 formed in the substrate 112. The EMW oscillating unit 194 includes a resonance tunnel diode (RTD) 101, a penetrating electrode 102a, a resonator 103 of a microstrip line type (MSL resonator 103), an antenna 104, a dielectric portion 107, and a GND layer 106. The MSL resonator 103, the antenna 104, and the GND layer 106 constitute a resonance structure.

The GND layer 106 is a ground portion for regulating a predetermined reference electric potential for the RTD 101 that is a gain portion, the MSL resonator 103 that is an EMW resonance portion, and the antenna 104 that is an EMW radiating portion. The MSL resonator 103 includes a phase stub 105, a first microstrip line (MSL) 109a, and a second MSL 109b. The substrate 112 includes penetrating electrode portions 102b, 102c, 102d and 102e formed therein, a GND penetrating electrode 110, and a shield 113. The shield 113 is provided extending in a planar direction of the substrate 112, and a potential of the shield 113 is set to a predetermined ground electric potential. The DC supplying portion 198 includes a lower DC signal line 190 and a lower DC electrode pad 117.

DC solder ball 114, DC electric wires 119a, 119b and 119c, DC bonding wire 118, GND solder ball 120, GND electric wire 115, and GND bonding wire 121 are disposed on an installation substrate 122 provided under the substrate 112.

More specifically, elements for oscillating an electromagnetic wave are disposed on the upper surface of the substrate 112 in the oscillator 100, while elements for supplying DC signal and ground signal required for the EMW oscillation are disposed on the lower surface of the substrate 112. The penetrating electrode 102 for connecting those elements on the upper and lower surfaces of the substrate 112 is provided in the substrate 112. The penetrating electrode 102 includes plural portions 102a through 102e. Members for electrically connecting the oscillator 100 to external apparatuses including a DC electric power source are arranged on the installation substrate 122.

Features and operation of the oscillator 100 of the first embodiment will be described. When the DC signal is supplied to the RTD 101, induced emission of an electromagnetic wave occurs in the RTD 101. The wavelength of the electromagnetic wave is an approximately single oscillation wavelength $\lambda$ ($\lambda$: the wavelength in vacuum) is a range of the THz wave, that is acquired due to the negative resistance of the RTD 101. The emitted electromagnetic wave is an electromagnetic wave with an effective wavelength $\lambda_g$ ($\lambda_g$: the wavelength in the dielectric portion 107) in the dielectric portion 107, and propagates in an MSL patch antenna 199. The MSL patch antenna 199 includes the MSL resonator 103, the antenna 104, the GND portion 111, the dielectric portion 107, the RTD 101, and the like. The propagating electromagnetic wave resonates as a standing wave, and is amplified in the MSL patch antenna 199.

Under some conditions, an electromagnetic wave with the oscillation wavelength is oscillated from the antenna 104. The oscillating conditions of the electromagnetic wave are the following qualitative conditions (1) and (2) that should be satisfied at the same time.

(1) The electromagnetic wave with the wavelength $\lambda_g$ amplified in the oscillator 100 should exceed a certain threshold. In other words, an EMW gain obtained by the resonance should exceed EMW losses (including an electric power consumed in the resonator) due to the structure of the oscillator 100.

(2) The phase matching of the resonating electromagnetic wave with the wavelength $\lambda_g$ should be achieved. Namely, the phase difference should be approximately zero.

In the structure of the first embodiment, the DC supplying portion 198 for supplying electric power to the RTD 101 and elements for supplying a signal thereto from outside are arranged on the location opposite to the surface of the substrate 112 on which the RTD 101 is arranged. Further, the penetrating electrode 102 is disposed at a place of the node of the standing wave in the EMW radiating portion 194, i.e., at a location where the amplitude of the standing electromagnetic field is approximately zero. Thereby, members necessary for the EMW radiating portion 194, such as the MSL resonator 103, are connected to the DC supplying members, such as the lower DC signal line 190, arranged on the lower surface of the substrate 112 in a DC manner through the penetrating electrode 102 formed in the substrate 112.

As a result, the DC supply to the RTD 101 can be performed with reduced influence on resonance characteristics of the standing wave, and the DC signal line and bonding electrode necessary for the DC power supply can be disposed on the lower surface of the substrate 112. Further, since the tolerance of layout on the upper surface of the substrate 112 increases, the flexibility of design of the oscillator 100 largely increases. Thus, density and integration of the oscillator 100 can be enhanced. It is hence possible to provide a small-sized high-power THz-wave source. It is also preferable to dispose the GND penetrating electrode 110 at a location of the node of the standing wave with the wavelength $\lambda_g$. However, even when those penetrating electrodes 102 and 110 are disposed at locations slightly shifting from the above node, somewhat advantageous effect can be obtained due to the arrangement in which the EMW radiating portion and the power supplying portion are disposed on different surfaces of the substrate.

A more specific exemplified design of the oscillator 100 of the first embodiment will be described referring to FIGS. 1, 2, 3A and 3B. Specific sizes of various portions are indicated in those figures (not to scale).

Furthermore, when the shield 113 for intercepting low-frequency electromagnetic wave is disposed in the substrate 112, or on its lower surface, noises, such as low-frequency noise from the power supplying side (i.e., the power supplying portion and the DC power source) can be intercepted or reduced. Accordingly, parasitic oscillation can be reduced, and the oscillation characteristics can be improved.

The oscillator 100 of the first embodiment can be designed such that a THz wave at an oscillation frequency of 340 GHz, namely, $\lambda$=840 microns and the effective wavelength $\lambda_g$=570 microns, can be oscillated. The dielectric portion 107 can be formed of benzocyclobutene (BCB) with a dielectric constant $\in_r$ of 2.8.

The specific structure of the radiating portion 194 will be described. The EMW radiating portion 194 can be an oscillating element of a type in which the RTD 101 is used as an active element, and the MSL patch antenna 199 is used as a passive element. The EMW radiating portion 194 can comprise RTD 101, penetrating electrode 102a, MSL resonator 103, antenna 104, dielectric portion 107, and GND layer 106. The MSL resonator 103 can include phase stub 105, MSL 109a, and MSL 109b.

In the EMW radiating portion 194, the RTD 101 is used as the negative resistance element. The RTD 101 can include an active layer with a triple barrier quantum well structure including a hetero junction of InGaAs/InAlAs, and upper and lower contact layers of n$^+$-InGaAs in which Si is highly doped. The structure of the active layer is as follows from the upper side of the oscillator 100: InGaAs (5.0 nm in thickness); InAlAs (2.66 nm); InGaAs (5.61 nm); InAlAs (2.66 nm); InGaAs (7.67 nm); InAlAs (2.66 nm); and InGaAs (5.0 nm). With respect of estimation of its current-voltage characteristic, −4.1 mS of the differential negative conductance (i.e., an inverse of the differential negative resistance) is confirmed.

In the MSL patch antenna 199 serving as the passive element, Au/Ti (3 kÅ/0.3 kÅ) can be used as the MSL resonator 103 and the antenna 104, a BCB with a thickness of 3 microns can be used as the dielectric portion 107, and Au/Cr (3 kÅ/0.5 kÅ) can be used as the GND layer 106. With respect to the MSL patch antenna 199, the negative conductance and the oscillation wavelength can have the above values, respectively, and the characteristic impedance can be 50Ω. According to a calculation using the high-frequency electromagnetic field simulator, the above construction with sizes indicated in FIGS. 1, 2, 3A and 3B (not to scale) is designed such that conditions for oscillation of a THz wave at 340 GHz are satisfied.

Structures of the DC supplying portion 198 for supplying the DC signal, and the substrate 112 including the penetrating electrode 102 will now be described.

The substrate 112 can be a Si substrate whose fine processing can be readily performed using conventional semiconductor processes. In the substrate 112, there are disposed the penetrating electrodes 102b through 102e for the DC power supply, the GND penetrating electrodes 110a through 110c for the GND supply, and the shield 113 set at the GND electric potential. The shield 113 can be provided in the form of a film extending in the planar direction of the substrate 112 and set to the GND electric potential.

The penetrating electrode 102a is connected to the penetrating electrodes 102c, 102d and 102e via the penetrating electrode 102b. Those electrodes 102a through 102e are further connected to the lower DC signal line 190 disposed on the lower surface of the substrate 112, and connected to the DC power source (not shown) via the DC solder ball 114 and the DC wire 119a disposed on the installation substrate 122, and the DC bonding wire 118. The GND penetrating electrode 110 connected to the GND layer 106 is connected to a lower GND pad 116, and connected to the ground (GND) via the GND solder ball 120 and the installation GND wire 115 disposed on the installation substrate 122, and the GND bonding wire 121. The shield 113 is connected to the GND penetrating electrode 110b, and connected to the GND. The substrate 112 can be entirely covered with an insulating layer 111 of thermally-oxidized SiO$_2$ to prevent the electric short circuit between the wires and electrodes, and the Si substrate 112. Sizes of the respective portions are indicated in FIGS. 1 to 3B (not to scale).

Materials of the respective portions of the penetrating electrode 102 can be as follows. The penetrating electrode 102a can be formed of Au (3 microns in thickness). The penetrating electrode 102b can be formed of Au/Cr (3 kÅ/0.5 kÅ). Each of the penetrating electrodes 102c and 102e can be formed of Cu (300 microns). The penetrating electrode 102d can be formed of Cr/Au/Cr (0.5 kÅ/6 kÅ/0.5 kÅ). Further, materials of the respective portions of the GND penetrating electrode 110 can be as follows. Each of the GND penetrating electrodes 110a and 111c can be formed of Cu (300 microns). The penetrating electrode 110b can be formed of Cr/Au/Cr (0.5 kÅ/6 kÅ/0.5 kÅ). The diameter of each electrode portion can be set to about 5 microns.

The operation of the oscillator 100 will be described. When the DC current is injected into the RTD 101 through the penetrating electrode 102, a THz wave can be inductively emitted by an energy state transition of electrons due to the resonance tunnel effect in the triple quantum well structure of the active layer. The THz wave can have a frequency of 340 GHz, and a wavelength λ in vacuum of 840 microns. The EMW gain at this time can be approximately estimated from the measured differential negative conductance of −4.1 mS. The thus-emitted THz wave at 340 GHz propagates as the standing wave with the effective wavelength $\lambda_g$ of 570 microns in the resonator formed by the RTD 101, the MSL patch antenna 199, the dielectric portion 107, and the GND layer 106.

The RTD 101 can be activated in a photon assist manner by the THz wave propagating in the resonator, and the induced emission can be repeated. Therefore, the THz wave at the frequency of 340 GHz is oscillated from the antenna 104 at a certain threshold of DC voltage that is approximately equal to a bias voltage at which the negative differential resistance can be obtained according to the current-voltage characteristic.

In the first embodiment, the penetrating electrode 102 can be disposed at the node of the standing wave of the THz wave in the resonator, where its electromagnetic field is approximately equal to zero. The diameter of the penetrating electrode 102 can be less than $\lambda_g/20$. Therefore, the penetrating electrode 102 can supply the DC power to the RTD 101 under conditions that the short circuit is established in terms of DC operation, the circuit is open in terms of high frequency operation, and the presence of the penetrating electrode 102 is negligible from the standpoint of the standing wave. Thus, the THz wave at 340 GHz can be oscillated from the oscillator of this embodiment. Further, the low frequency noise (less than about several tens MHz) from the DC power source can be prevented by the grounded shield 113 that extends approximately perpendicular to the thickness direction of the substrate 112. Accordingly, parasitic oscillation and harmonics oscillation due to the above factors can be reduced, and the oscillation characteristic can be improved.

FIGS. 3A and 3B illustrate upper and lower surfaces 300a and 300b of an oscillator array in which the above-discussed oscillators 100 are arranged in an array of 5×3, respectively. For the purpose of illustration, the installation substrate and so forth are omitted in FIGS. 3A and 3B. The arrangement pitch of the oscillators 100a to 100o and the distance between the adjacent oscillators are indicated in FIGS. 3A and 3B. For example, the shortest distance between the EMW radiating portions 194 of one oscillator and its adjacent oscillator is about 416 microns, and its layout satisfies the condition that such distance should be larger than $\lambda_g/2$. In FIGS. 3A and 3B, for example, the oscillator 100h on the upper surface 300a corresponds to the lower DC electrode pad 117h and the lower DC wire 190h on the lower surface 300b. Further, lower GND pads 116a, 116b, 116c and 116d are arranged at four corners of the lower surface 300b in a horizontally and vertically symmetrical manner, respectively.

Furthermore, as illustrated in FIG. 2, on the installation substrate 122, there can be arranged installation DC wires for other oscillators, for example, the installation DC wires 119b and 119c for the oscillators 100b and 100c. When the oscillators 100 of this embodiment are densely integrated in an array as described above, the oscillator array with enhanced output power can be readily achieved. Further, a small-sized THz-wave oscillator array with high output power can be provided. In those structures, high output power is obtained, for example, by synchronously oscillating the arrayed oscillators in an in-phase manner.

The fabrication technique of the oscillator 100 of this embodiment will be described. Conventional semiconductor processing techniques can be used.

(1) A first substrate for the EMW radiating portion 194 is prepared. In this embodiment, there is prepared an epitaxial substrate in which the quantum well structure of InGaAs and InAlAs for the active layer are grown on a semi-insulating InP substrate using molecular beam epitaxy (MBE). A layer of Au/Cr (3 kÅ/0.3 kÅ) for a portion of the GND layer 106 is formed on the epitaxial surface of the above epitaxial substrate by a sputtering technique.

(2) Substrates 112a and 112b for the substrate 112 including the DC supplying portion 198 and the penetrating electrode 102 are prepared. The substrate 112a is fabricated in the following manner. The fabrication process of the substrate 112b is omitted since this is the same as that of the substrate 112a.

By a Si Deep RIE technique using conventional photolithography and Bosch process, penetrating holes with a diameter of 10 microns are formed in the Si substrate. The holes are formed at locations corresponding to the positions of the penetrating electrode 102 and the GND penetrating electrode 110, respectively. Thermally oxidized $SiO_2$ with a thickness of 1 micron is formed on the surface of the Si substrate with the penetrating holes therein, by a thermal oxidization technique using hydrogen and oxygen. This thermally oxidized $SiO_2$ corresponds to the insulating layer 111.

Thereafter, the penetrating holes in the Si substrate are filled with Cu and TiN by a metal organic-chemical vapor deposition (MOCVD) technique. Further, Cu deposited on upper and lower surfaces of the Si substrate is selectively removed by a chemical mechanical polishing (CMP) technique, and penetrating electrodes are thus formed in the Si substrate. Those penetrating electrodes correspond to the penetrating electrodes 102b and 102c, and the GND penetrating electrode 110a, respectively.

A layer of Au/Cr (3 kÅ/0.3 kÅ) is formed on upper and lower surfaces of the Si substrate with the penetrating electrodes by the sputtering technique. The layer of Au/Cr corresponds to the GND layer 106, the shield 113, the lower DC signal line 190, and the lower GND pad 116. A desired pattern is formed by etching the layer of Au/Cr on upper and lower surfaces of the Si substrate using photolithography and Au/Cr-RIE technique. The desired pattern is, for example, an electrode pattern as illustrated on the lower surface 300b of the oscillator array in FIG. 3B. The desired pattern is situated at locations corresponding to positions of the penetrating electrode 102, the GND electrode 110, etc.

(3) The first substrate, and substrates 112a and 112b are prepared. The lower surface of the substrate 112a is caused to face the upper surface of the substrate 112b, and their positions are aligned. Those surfaces are bonded by Au thermal pressure or solderless bonding technique. The substrate is thus fabricated. Then, the epitaxial surface of the first substrate is caused to face the upper surface of the substrate 112, and their positions are aligned. Those surfaces are bonded by Au thermal pressure or solderless bonding technique. A second substrate composed of the substrate 112 bonded to the first substrate is thus fabricated. Only the InP portion of the second substrate, i.e., the semi-insulating InP of the first substrate, is selectively removed by etching using polishing technique and wet etching technique. The InGaAs surface is thus exposed.

(4) Using EB (electron beam) drawing technique and RIE technique, the epitaxial layer composed of InGaAs/InAlAs and the like is removed to form a post corresponding to the RTD 101. Then, BCB corresponding to the dielectric portion 107 is deposited by spin-coating. An upper portion of the post corresponding to the RTD 101 is exposed by slightly removing the BCB using the RIE technique. A pattern of Au/Cr is formed by photolithography and lift-off technique. This pattern corresponds to the MSL patch antenna 199. An opening is formed in the BCB of the dielectric layer 107 by photolithography and RIE technique to expose the Au layer corresponding to the penetrating electrode 102b.

A layer of Au (3 microns in thickness) is formed by electroplating technique to form an Au electrode corresponding to the penetrating electrode 102a. Using photolithography and lift-off technique, a pattern of Au/Cr is formed to form the Au pattern corresponding to the MSL patch antenna 199. The second substrate is placed on the installation substrate 122 by flip-chip bonding technique, and the bonded substrates are connected to the external circuit by wire bonding technique. The oscillator 100 is thus constructed.

In the above description, Si with characteristics of high aspect and preferable fine processing capability is used as a material of the substrate 112. However, compound semiconductor substrate such as InP and GaAs, quartz, sapphire, ceramics, and the like can also be used as the substrate 112. Selection of the substrate material can be an important factor for determining the length of the resonator relevant to a desired oscillation wavelength. This material can be appropriately selected in the light of the oscillation wavelength, the fine processing capability (precision), and data of the material (dielectric constant and so forth).

Figure 4:
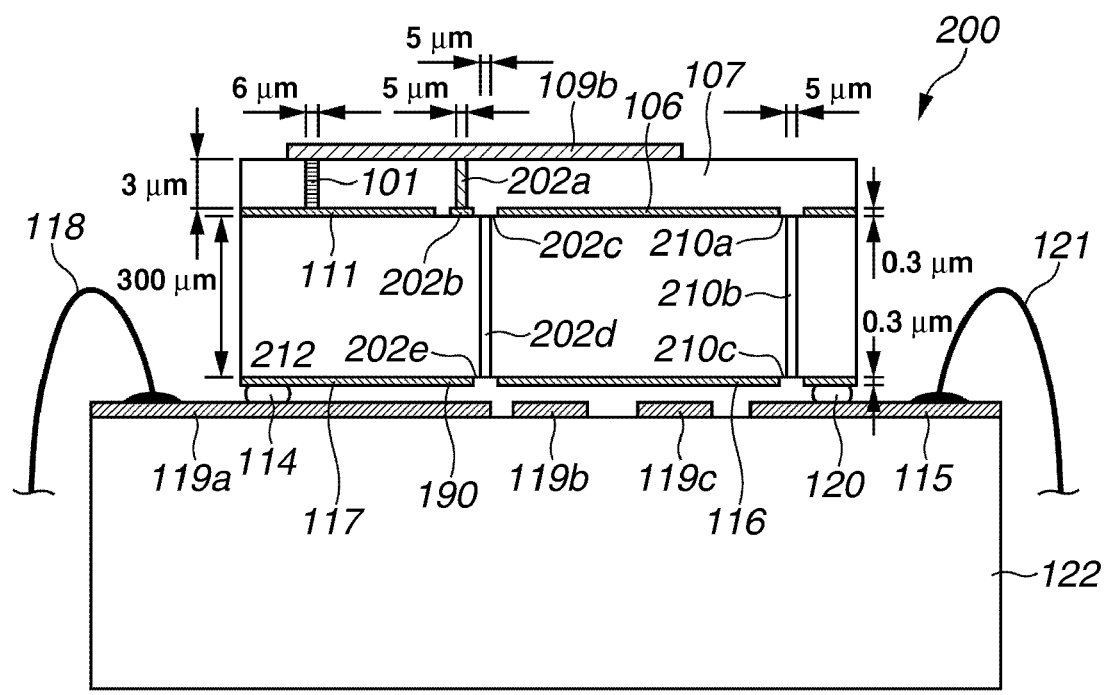
FIG. 4 is a cross-sectional view illustrating a second embodiment of an EMW oscillator according to the present invention.

Next, details of an oscillator of a second embodiment will be described referring to FIG. 4. Specific sizes of various portions of the second embodiment are indicated in FIG. 4 (not to scale). With respect to portions of upper surface, basic structure and materials of the oscillator similar to those of the first embodiment, illustration and description of the oscillator of the second embodiment are omitted.

Similar to the first embodiment, an oscillator 200 of the second embodiment is designed such that a THz wave at the oscillation frequency of 340 GHz, namely, $\lambda=840$ microns and the effective wavelength $\lambda_g=570$ microns, can be oscillated. The dielectric portion 107 is formed of BCB. Therefore, detailed description of the structure of the EMW radiating portion 194 is omitted.

In the second embodiment, a penetrating electrode 202 for the DC power supply, and a GND penetrating electrode 210 for connection to the GND are in the form of a circular waveguide. A substrate 212 is a Si substrate, similar to the first embodiment. In the dielectric portion 107 and the substrate 212, there are disposed penetrating electrode portions 202a through 202e for the DC power supply, and GND penetrating electrode portions 210a through 210c for the connection to the GND at predetermined locations, respectively. The penetrating electrode 202a is connected to the penetrating electrode 202c via the penetrating electrode 202b.

Since the penetrating electrodes 202c to 202e are integrally formed in the fabrication process, they are automatically connected to each other. The penetrating electrode 202d is connected to the lower DC signal line 190 disposed on the lower surface of the substrate 212, through the penetrating electrode 202e. The lower DC signal line 190 and the lower DC electrode pad 117 are connected to the DC wire 119a disposed on the installation substrate 122, via the DC solder ball 114, and connected to external apparatuses such as the DC power source (not shown), via the DC bonding wire 118.

The GND layer 106 is connected to the GND penetrating electrode 210b via the GND penetrating electrode 210a. The GND penetrating electrode 210b is connected to the lower GND pad 116 disposed on the lower surface of the substrate 212, via the GND penetrating electrode 210c. The lower GND pad 116 is connected to the installation GND wire 115 disposed on the installation substrate 122, via the GND solder ball 120, and connected to the ground (GND) via the GND bonding wire 121. The substrate 212 is entirely covered with the insulating layer 111 of thermally-oxidized $SiO_2$ to prevent the electric short circuit between the wires and electrodes, and the Si substrate 212. Sizes of the respective portions are indicated in FIG. 4 (not to scale).

Materials of the respective portions of the penetrating electrode 202 are as follows. The penetrating electrode 202a is formed of Au (3 microns in thickness). The penetrating electrode 202b is formed of Au/Cr (3 kÅ/0.5 kÅ). Each of the penetrating electrodes 202c, 202d and 202e is formed of Pd (300 microns in depth, and 1 micron in thickness). Further, all materials of the respective portions 210a, 210b and 210c of the GND penetrating electrode 210 are Pd (300 microns in depth, and 1 micron in thickness). Inner diameters of waveguides of the penetrating electrode 202 and the GND penetrating electrode 210 are set to about 5 microns.

The operation of the oscillator 200 of the second embodiment is similar to that of the first embodiment. In the second embodiment, the penetrating electrode has the waveguide structure, so that electromagnetic waves at low frequencies less than the cutoff frequency can be shielded. Thereby, the low frequency noise (less than about several tens of MHz) from the DC power source can be intercepted. Accordingly, parasitic oscillation and harmonics oscillation due to the above factors can be prevented, and the oscillation characteristic can be improved.

The oscillator 200 can be readily fabricated by a method similar to the fabrication method of the first embodiment. In this method, Pd is formed using an electroless plating method, in place of formation of the penetrating electrodes by MOCVD.

As described above, in the second embodiment, electromagnetic waves at low frequencies less than the cutoff frequency can be intercepted by the waveguide with a cavity in the penetrating electrode, and the low frequency noise from the DC power source can be reduced, leading to improvement of the oscillation characteristic. It is also possible to enhance the shielding effect by loading the above cavity of the waveguide with resin, or the like.

Figure 5:
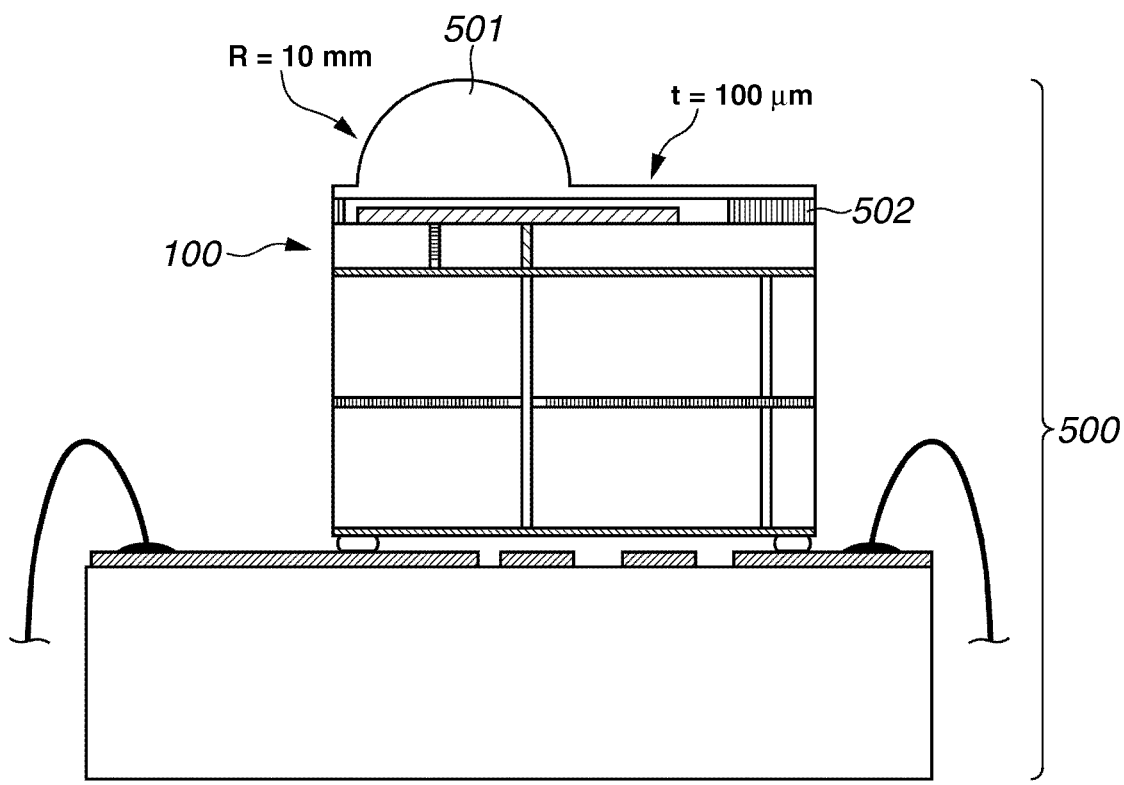
FIG. 5 is a cross-sectional view illustrating a third embodiment of an EMW oscillator with a layered lens plate according to the present invention.
Figure 6A:
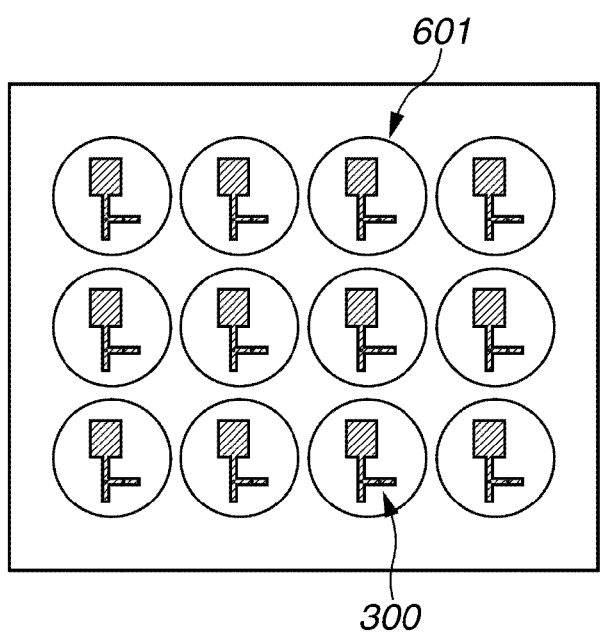
FIG. 6A is a plan view illustrating the third embodiment of an oscillator of a first type including arrayed EMW oscillating elements with layered lens plates.
Figure 6B:
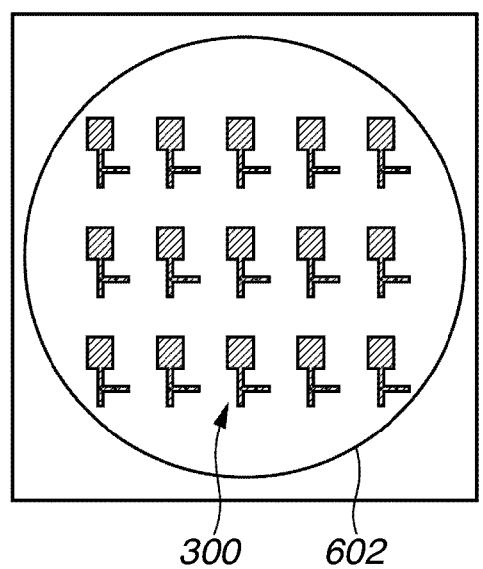
FIG. 6B is a plan view illustrating the third embodiment of an oscillator of a second type including arrayed EMW oscillating elements with a layered lens plate.
Figure 7:
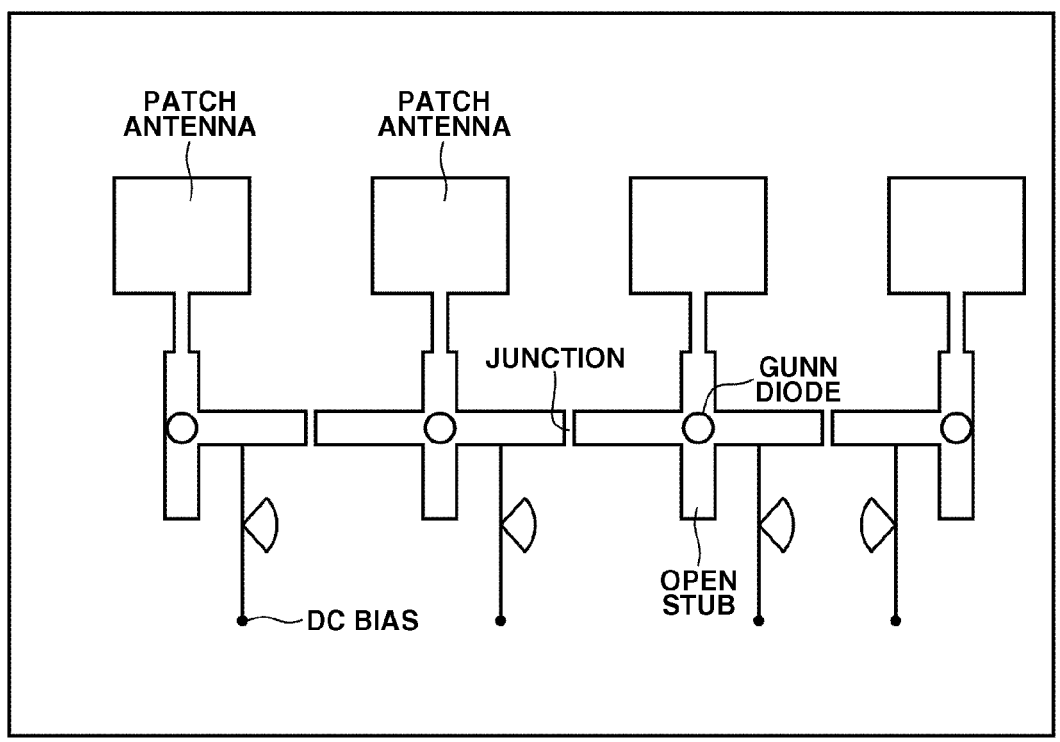
FIG. 7 is a plan view illustrating a conventional oscillator including arrayed EMW oscillating elements.

Next, details of an oscillator of a third embodiment will be described referring to FIGS. 5, 6A and 6B. FIG. 5 is a cross-sectional view illustrating the third embodiment, in which a lens substrate 501 with a curve such as a semi-sphere or an ellipsoid is placed on the oscillator. FIGS. 6A and 6B are plan views illustrating oscillators with lens structures of two types, respectively. Specific sizes of the lens substrate 501 are indicated in FIG. 5 (not to scale). Illustration and description of portions of the third embodiment similar to those of the first embodiment are omitted.

As illustrated in FIG. 5, in the oscillator 500 of the third embodiment, the semi-spherical lens substrate 501 is placed on the oscillator 100 designed such that the THz wave at the frequency of 340 GHz can be oscillated as described in the first embodiment. The radius of the semi-spherical lens portion is 10 mm, and the thickness of its substrate is 100 microns. FIGS. 6A and 6B illustrate two arrangements of the lens substrate. In the structure of FIG. 6A, an array of microlenses 601 are disposed at the same pitch as that of an array of oscillators 300. In the structure of FIG. 6B, a single silicon semi-spherical lens 602 is disposed on the array of oscillators 300.

In the third embodiment, the lens substrate 501 is formed of resin of the cycloolefin group that has a relatively small dielectric loss for a THz wave, and an excellent processing capability. The lens substrate 501 is produced by molding technique using a conventional metal mold for fine process machining. A material with a small loss for the THz wave is preferable as the lens material that is selected in the light of the lens profile and the processing capability. Inorganic materials, such as silicon, ceramics, and glass, organic materials, such as polyethylene and Teflon (trade mark), and the like can also be used.

The lens substrate 501 is connected to the oscillator 100 through a spacer 502. In this embodiment, the spacer 502 is a double-stick adhesive tape made of polyethylene terephthalate (PET) that has a high processing capability, and is 100 microns in thickness. After the substrate of the oscillator 100 and the lens substrate 501 are aligned to the spacer 502, they are subjected to thermal solderless bonding at 80 degrees Celsius. The spacer 502 serves as a spacer layer for determining the distance between the upper surface of the substrate of the oscillator 100 and the lens substrate 501, as well as a physical connecting layer. By regulating the plate thickness of the spacer 502, the coupling efficiency of an electromagnetic wave generated from the oscillator 100 to the lens substrate 501 can be optimized.

As another material of the spacer 502, it is possible to use silicon that has an excellent capability of controlling the above plate thickness. In this case, an adhesive resin is used, and the device is fabricated by a die bonding technique. Further, when the spacer 502 is made of an epoxy adhesive or the like, the lens substrate 501 can be directly bonded.

In the EMW oscillator with the arrangement of the penetrating electrode for the DC power supply, there is no need of arranging members for the power supply on the upper surface of the oscillator. Therefore, as described above, the lens substrate 501 can be placed on the upper surface of the oscillator 100. Accordingly, an electromagnetic wave radiated from the oscillator 100 can be coupled to the curved lens, such as the semi-spherical lens and the ellipsoidal lens, be shaped, and be efficiently picked out.

Except as otherwise disclosed herein, the various components shown in outline or in block form in the figures are individually well-known and their internal construction and operation are not critical either to the making or using of the present invention or to a description of the best mode of the invention.

While the present invention has been described with respect to what is presently considered to be the embodiments and examples, it is to be understood that the invention is not limited to the disclosed embodiments and examples. The present invention is intended to cover various modifications and equivalent arrangements included within the spirit and the scope of the appended claims.

What is claimed is:

1. An oscillator for emitting terahertz waves, the oscillator comprising:
    a substrate, the substrate having a first surface, and a second surface on a side opposite to a side on which the first surface is located;
    a layer including a gain portion;
    a first electrode and a second electrode which are electrically connected to the gain portion;
    an oscillation unit disposed on the first surface of the substrate and formed by sandwiching the layer between the first electrode and the second electrode;
    a third electrode disposed on the second surface of the substrate; and
    a first penetrating electrode penetrating the inside of the substrate and connecting the first electrode and the third electrode,
    wherein the oscillation unit radiates terahertz waves generated by supplying electric power from the third electrode to the gain portion through the first penetrating electrode and the first electrode.

2. The oscillator according to claim 1, wherein the first penetrating electrode is disposed at a node of a standing wave of an electromagnetic field resonating in the electromagnetic-wave oscillating unit.

3. The oscillator according to claim 1, wherein the oscillation unit is disposed on the first surface by bringing the first electrode or the second electrode into contact with the first surface.

4. The oscillator according to claim 1, further comprising:
    a fourth electrode disposed on the second surface; and
    a second penetrating electrode penetrating the inside of the substrate and connecting the second electrode and the fourth electrode.

5. The oscillator according to claim 4, wherein a reference electric potential for the gain portion is regulated by grounding the fourth electrode.

6. The oscillator according to claim 1, wherein the oscillation unit includes a radiating portion electrically connected to the gain portion and is formed such that the terahertz waves are radiated from the radiating portion.

7. An oscillator for emitting terahertz waves, the oscillator comprising:
    a substrate having a first surface, an oscillation unit disposed on the first surface and including
    (i) a layer having a gain portion, and
    (ii) a first and a second electrode sandwiching the layer, the first and second electrode being electrically connected to the gain portion;
    a third electrode disposed on a second surface on which the oscillation unit is not located; and
    a first penetrating electrode penetrating the inside of the substrate and connecting the first electrode and the third electrode,
    wherein the oscillation unit radiates terahertz waves generated by supplying electric power from the third electrode to the gain portion through the first penetrating electrode and the first electrode.

* * * * *